(12) United States Patent
Lee

(10) Patent No.: US 10,387,245 B2
(45) Date of Patent: Aug. 20, 2019

(54) RAID SYSTEM INCLUDING NONVOLATILE MEMORIES

(71) Applicant: SAMSUNG ELECTRONICS CO., LTD., Suwon-si (KR)

(72) Inventor: Ju Pyung Lee, Incheon (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 210 days.

(21) Appl. No.: 15/645,248

(22) Filed: Jul. 10, 2017

(65) Prior Publication Data
US 2018/0129562 A1 May 10, 2018

(30) Foreign Application Priority Data
Nov. 9, 2016 (KR) .................. 10-2016-0148741

(51) Int. Cl.
*G06F 11/00* (2006.01)
*G06F 11/10* (2006.01)
*G11C 29/52* (2006.01)

(52) U.S. Cl.
CPC ...... *G06F 11/1068* (2013.01); *G06F 11/1088* (2013.01); *G11C 29/52* (2013.01)

(58) Field of Classification Search
CPC ............ G06F 11/1084; G06F 11/1088; G06F 11/1098
USPC ...................................... 714/6.21
See application file for complete search history.

(56) References Cited

U.S. PATENT DOCUMENTS

| | | |
|---|---|---|
| RE36,846 E | 8/2000 | Ng et al. |
| 7,313,721 B2 | 12/2007 | Ashmore |
| 7,647,526 B1 | 1/2010 | Taylor |
| 8,463,798 B1 | 6/2013 | Claudatos et al. |
| 8,589,625 B2 | 11/2013 | Colgrove et al. |
| 8,589,724 B2 | 11/2013 | Gaertner et al. |
| 8,751,861 B2 | 6/2014 | Nair et al. |
| 8,782,292 B2 | 7/2014 | Madhusudana et al. |
| 9,053,075 B2 | 6/2015 | Watanabe et al. |
| 2006/0206753 A1* | 9/2006 | Yamato ............... G06F 11/1092 714/6.32 |
| 2014/0255147 A1* | 9/2014 | Root ..................... F01D 25/285 415/1 |
| 2014/0365819 A1 | 12/2014 | Cooper et al. |
| 2015/0269025 A1* | 9/2015 | Krishnamurthy ... G06F 11/1092 714/6.24 |
| 2016/0239384 A1* | 8/2016 | Slik .......................... G06F 16/22 |
| 2017/0364271 A1* | 12/2017 | Han ...................... G06F 3/0604 |

\* cited by examiner

*Primary Examiner* — Sarai E Butler
(74) *Attorney, Agent, or Firm* — Sughrue Mion, PLLC

(57) ABSTRACT

Provided is a RAID system that includes a memory device including a plurality of nonvolatile memories storing data chunks and first and second parity bits corresponding to the data chunks, a RAID controller configured to control a RAID operation and a rebuild operation of the memory device, and a host configured to communicate with the RAID controller at an input/output (I/O) rate. The RAID controller is configured to perform a first rebuild operation using the first parity bit and a first policy having a first rebuild rate, to perform a second rebuild operation using the first and second parity bits and a second policy having a second rebuild rate, to apply a first sub-rate as the first rebuild rate until the I/O rate reaches a predetermined value, and to apply a second sub-rate as the first rebuild rate when the I/O rate is greater than the predetermined value.

20 Claims, 12 Drawing Sheets

FIG. 2A

| | | DATA CHUNK | | | | PARITY | | | |
|---|---|---|---|---|---|---|---|---|---|
| CHIP1 | CHIP2 | CHIP3 | CHIP4 | CHIP5 | CHIP6 | CHIP7 | CHIP8 | CHIP9 | CHIP10 |
| D1 | D2 | D3 | D4 | D5 | D6 | P1 | Q1 | S | S |
| D7 | D8 | D9 | D10 | D11 | P7 | Q7 | D12 | S | S |
| D13 | D14 | D15 | D16 | P13 | Q13 | D17 | D18 | S | S |
| D19 | D20 | D21 | P19 | Q19 | D22 | D23 | D24 | S | S |
| D25 | D26 | P25 | Q25 | D27 | D28 | D29 | D30 | S | S |
| D31 | P31 | Q31 | D32 | D33 | D34 | D35 | D36 | S | S |
| P37 | Q37 | D37 | D38 | D39 | D40 | D41 | D42 | S | S |
| Q43 | D43 | D44 | D45 | D46 | D47 | D48 | P43 | S | S |

FIG. 2B

| | CHIP1 | CHIP2 | CHIP3 | CHIP4 | CHIP5 | CHIP6 | CHIP7 | CHIP8 | CHIP9 | CHIP10 |
|---|---|---|---|---|---|---|---|---|---|---|
| | D1 | D2 | D3 | D4 | D5 | D6 | P1 | Q1 | D5 | S |
| | D7 | D8 | D9 | D10 | D11 | P7 | Q7 | D12 | D11 | S |
| | D13 | D14 | D15 | D16 | P13 | Q13 | D17 | D18 | P13 | S |
| | D19 | D20 | D21 | P19 | Q19 | D22 | D23 | D24 | Q19 | S |
| | D25 | D26 | P25 | Q25 | D27 | D28 | D29 | D30 | S | S |
| | D31 | P31 | Q31 | D32 | D33 | D34 | D35 | D36 | S | S |
| | P37 | Q37 | D37 | D38 | D39 | D40 | D41 | D42 | S | S |
| | Q43 | D43 | D44 | D45 | D46 | D47 | D48 | P43 | S | S |

↑ 1st failure

RAID SYSTEM INCLUDING NONVOLATILE MEMORIES

This application claims priority from Korean Patent Application No. 10-2016-0148741, filed on Nov. 9, 2016 in the Korean Intellectual Property Office, the disclosure of which is incorporated herein in its entirety by reference.

BACKGROUND

1. Field

Apparatuses and methods consistent with one or more exemplary embodiments relate to a redundant array of inexpensive disks (RAID) system, and more particularly, to a RAID system including nonvolatile memories.

2. Description of the Related Art

A redundant array of inexpensive disks (RAID) is a method commonly used in a storage medium such as a server having important data. In this method, parity is stored in one of various storage media. Therefore, even when a failure occurs in data stored in a particular storage medium, the data can be restored to normal data. The RAID can balance input/output (I/O) operations and improve the overall performance of the server.

Among RAID configurations. RAID level 5 or RAID level 6 in which parity bits are distributed and stored is used in a system for ensuring data integrity. RAID level 5 is a method in which one parity bit is distributed and stored for each data chunk, and RAID level 6 is a method in which two parity bits are distributed and stored for each data chunk. When two drives fail, RAID level 6 can rebuild data of the failed drives using two parity bits.

The rebuild process is an operation of generating lost data by accessing parity bits and data included in the entire RAID system. Therefore, the rebuild process can take a large amount of time and can have a great influence on the I/O performance of the entire RAID system. In this regard, there may be a need for a rebuild policy for quickly restoring data while ensuring overall system performance by adjusting the I/O bandwidth for rebuilding and the usual I/O bandwidth.

SUMMARY

Aspects of one or more exemplary embodiments provide a redundant array of inexpensive disks (RAID) system which can quickly restore data and ensure system performance by varying a rebuild management policy according to the degree of failure of a solid state drive (SSD) included in the RAID system.

However, aspects are not restricted thereto. The above and other aspects will become more apparent to one of ordinary skill in the art to which the disclosure pertains by referencing the detailed description of exemplary embodiments given below.

According to an aspect of an exemplary embodiment, there is provided a RAID system including: a memory device including a plurality of nonvolatile memories forming a RAID and storing data chunks and a first parity bit and a second parity bit corresponding to the data chunks; a RAID controller configured to control a RAID operation and a rebuild operation of the memory device; and a host configured to communicate with the RAID controller at an input/output (I/O) rate, wherein the RAID controller is configured to control: to perform a first rebuild operation using the first parity bit stored in the memory device and a first rebuild management policy having a first rebuild rate, to apply a first sub-rate as the first rebuild rate until the I/O rate between the RAID controller and the host reaches a predetermined value, to apply a second sub-rate, different from the first sub-rate, as the first rebuild rate when the I/O rate is greater than the predetermined value, and to perform a second rebuild operation using the first parity bit and the second parity bit stored in the memory device and a second rebuild management policy having a second rebuild rate different from the first rebuild rate.

According to an aspect of another exemplary embodiment, there is provided a RAID system including: a host; and a plurality of solid state drives (SSDs) coupled to the host, wherein each of the plurality of SSDs includes: a plurality of nonvolatile memories which form a RAID and store data chunks and a first parity bit and a second parity bit corresponding to the data chunks; and a RAID controller configured to control a RAID operation and a rebuild operation of the plurality of nonvolatile memories, wherein the RAID controller is configured to control to perform a first rebuild operation using the first parity bit stored in the plurality of nonvolatile memories and a first rebuild management policy having a first rebuild rate, and to perform a second rebuild operation using the first parity bit and the second parity bit stored in the plurality of nonvolatile memories and a second rebuild management policy having a second rebuild rate different from the first rebuild rate.

According to an aspect of another exemplary embodiment, there is provided a method of performing a rebuild operation in a memory device forming a RAID and storing data chunks and a first parity bit and a second parity bit corresponding to the data chunks, the method including: in response to a first failure in the memory device, controlling to perform a first rebuild operation using the first parity bit stored in the memory device and a first rebuild management policy having a first rebuild rate; and in response to a second failure in the memory device, controlling to perform a second rebuild operation using the first parity bit and the second parity bit stored in the memory device and a second rebuild management policy having a second rebuild rate different from the first rebuild rate.

BRIEF DESCRIPTION OF THE DRAWINGS

These and/or other aspects will become apparent and more readily appreciated from the following description of exemplary embodiments, taken in conjunction with the accompanying drawings in which:

FIGS. 2A through 2C are conceptual diagrams for explaining a rebuild operation performed by the RAID system according to an exemplary embodiment;

DETAILED DESCRIPTION

Hereinafter, redundant array of inexpensive disks (RAID) systems according to exemplary embodiments will be described with reference to FIGS. 1 through 9.

Figure 1:
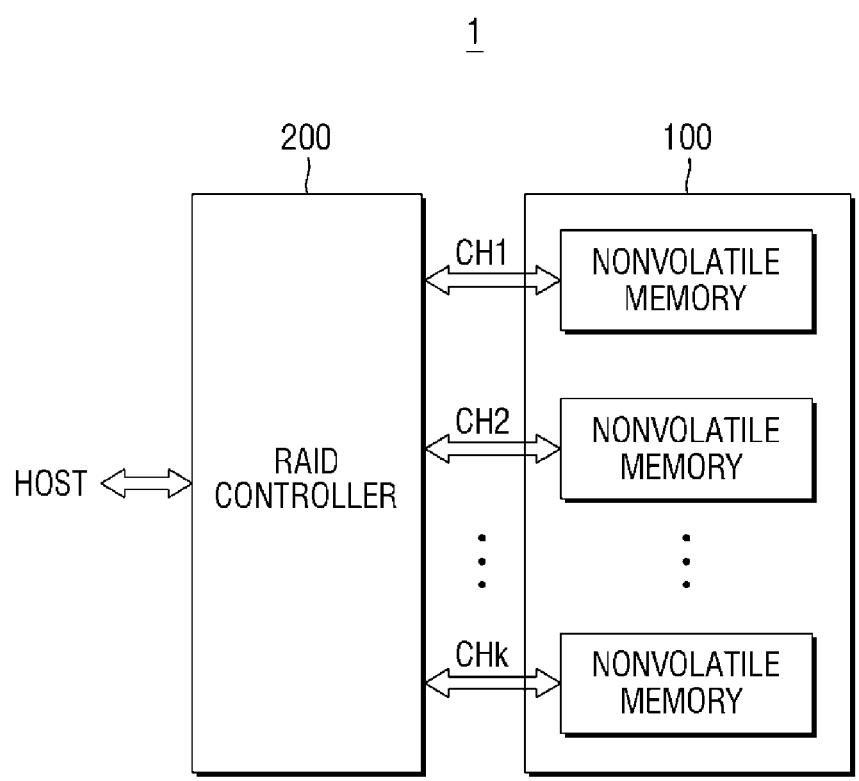
FIG. 1 is a block diagram of a redundant array of inexpensive disks (RAID) system according to an exemplary embodiment.

FIG. 1 is a block diagram of a RAID system 1 according to an exemplary embodiment.

Referring to FIG. 1, the RAID system 1 includes a memory system 100 and a RAID controller 200.

The memory system 100 may include, for example, a plurality of nonvolatile memory chips. The nonvolatile memory chips may communicate with the RAID controller 200 through. e.g., first through $k^{th}$ channels CH1 through CHk.

According to an exemplary embodiment, each of the nonvolatile memory chips included in the memory system 100 may be a solid state drive (SSD). That is, the memory system 100 may include a plurality of SSDs that form one RAID.

The RAID controller 200 may be coupled to a host and the memory system 100. The RAID controller 200 may be configured to access the nonvolatile memory system 100 in response to a request from the host. For example, the RAID controller 200 may be configured to control read, write, erase, and background operations of the nonvolatile memory system 100.

The RAID controller 200 may be configured to provide an interface between the nonvolatile memory system 100 and the host. In addition, the RAID controller 200 may be configured to drive firmware for controlling the nonvolatile memory system 100.

In an example, the RAID controller 200 may further include additional components such as a random access memory (RAM), a processing unit (e.g., processor or processing core), a host interface, and a memory interface. The RAM may be used as at least one of an operation memory of the processing unit, a cache memory between the nonvolatile memory system 100 and the host, and a buffer memory between the nonvolatile memory system 100 and the host. The processing unit may control the overall operation of the RAID controller 200.

The RAID controller 200 according to the present exemplary embodiment may perform RAID rebuilding on the memory system 100. Specifically, the RAID controller 200 may perform RAID rebuilding on the memory system 100 on a stripe-by-stripe basis.

A configuration of the RAID system 1 according to an exemplary embodiment will now be described with reference to FIGS. 2A through 2C.

Figure 2C:
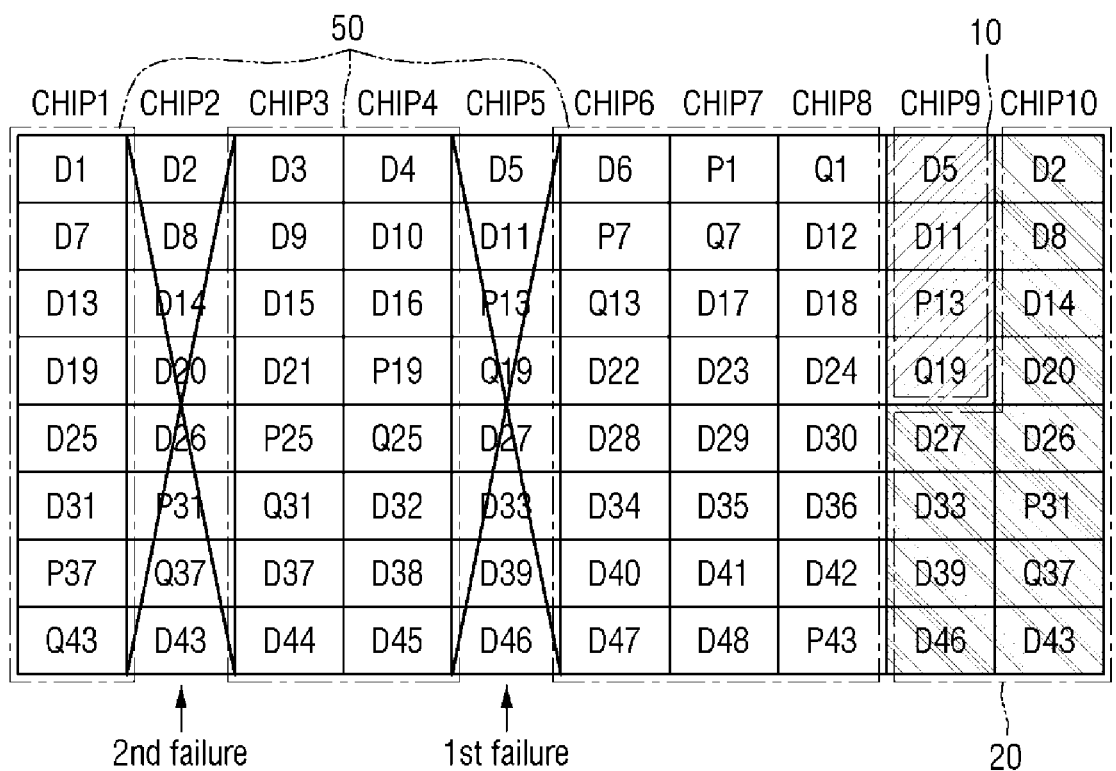

FIGS. 2A through 2C are conceptual diagrams for explaining a rebuild operation performed by the RAID system 1 according to an exemplary embodiment.

Referring to FIG. 2A, the memory system 100 of the RAID system 1 according to an exemplary embodiment may include a plurality of memory chips CHIP1 through CHIP10 which store data. More specifically, the memory system 100 may include eight nonvolatile memories CHIP1 through CHIP8 which store data and two spare or additional nonvolatile memories CHIP9 and CHIP10 which store data rebuilt in the event of a failure.

It is understood that one or more other exemplary embodiments are not limited to the number of nonvolatile memories for storing data as eight, or the number of additional nonvolatile memories for storing rebuilt data as two. It will be apparent to those skilled in the art that the number of nonvolatile memories for storing data that constitute data chunks can vary according to the configuration of the RAID system 1.

The nonvolatile memory chips CHIP1 through CHIP10 included in the RAID system 1 may have stripes defined as rows in a data structure shown in FIGS. 2A through 2C. In an exemplary embodiment, each stripe may include six data chunks and two parity bits. In FIGS. 2A through 2C, data chunks are indicated by reference characters D1 through D48, and two parity bits are indicated by reference characters P1 through P43 and Q1 through Q43, respectively.

The two spare nonvolatile memories CHIP9 and CHIP10 store data rebuilt in the event of failure of the eight nonvolatile memories CHIP1 through CHIP8 that store data chunks and parity bits. In FIG. 2A, storage spaces S of the two spare nonvolatile memories CHIP9 and CHIP10 are empty because a failure and a rebuild operation corresponding to the failure have not yet occurred.

Referring to FIG. 2B, when a failure occurs in a nonvolatile memory (e.g., CHIP5) included in the RAID system 1, the RAID controller 200 initiates a rebuild operation on the nonvolatile memory CHIP5. For ease of description, a nonvolatile memory (e.g., CHIP5) first to have a failure will hereinafter be referred to as a first nonvolatile memory.

As illustrated in FIG. 2B, only the first nonvolatile memory CHIP5 among the nonvolatile memory of the memory system 100 has a failure. Therefore, the RAID controller 200 sequentially rebuilds data 10 of the first nonvolatile memory CHIP5 using data stored in the non-failed nonvolatile memories CHIP1 through CHIP4 and CHIP6 through CHIP8 and one parity bit (P parity) and sequentially stores the rebuilt data 10 in the spare nonvolatile memory CHIP9.

That is, when a failure occurs in one of a plurality of nonvolatile memories of the memory system 100, the RAID system 1 according to the present exemplary embodiment performs a rebuild operation using only one parity bit (e.g., P parity only) among the parity bits.

As described above, according to an exemplary embodiment, when a failure occurs in a nonvolatile memory, the RAID controller 200 may perform a first rebuild operation using one parity bit (e.g., P parity only).

Referring to FIG. 2C, while the first nonvolatile memory CHIP5 is being rebuilt, a failure may occur in another nonvolatile memory (e.g., CHIP2). In this case, a rebuild operation may be simultaneously performed on the two failed nonvolatile memories CHIP2 and CHIP5. In addition, the rebuild operation is performed using two parity bits P and Q to rebuild data stored in the two nonvolatile memories CHIP2 and CHIP5.

As described above, according to an exemplary embodiment, when a failure occurs in two nonvolatile memories, the RAID controller 200 may perform a second rebuild operation using two parity bits P and Q.

In FIG. 2C, data rebuilt as a result of completing a rebuild operation on the two failed nonvolatile memories CHIP2 and CHIP5 is stored in the spare nonvolatile memories CHIP9 and CHIP10. In FIG. 2C, data 10 rebuilt through the first rebuilding operation of the RAID controller 200 and data 20 rebuilt through the second rebuild operation of the RAID controller 200 are shaded differently. For ease of description, a nonvolatile memory (e.g., CHIP2) that is the second to have a failure will hereinafter be referred to as a second nonvolatile memory.

In one or more exemplary embodiments, the first rebuild operation and the second rebuild operation may be performed in different environments. More specifically, the RAID controller 200 may control the first rebuild operation and the second rebuild operation using rebuild management policies having different rebuild rates in the first rebuild operation and the second rebuild operation.

This may be due to the following reason. The RAID system 1 according to an exemplary embodiment may bind a plurality of nonvolatile memories together to simultaneously input or output data to or from the nonvolatile memories in response to a data access request. Thus, the RAID system 1 according to an exemplary embodiment may be faster than a single system. However, even the RAID system 1 has limited input/output (I/O) bandwidth or throughput for accessing data internally or externally.

During a rebuild operation, the RAID system 1 may, albeit not noticeable externally, continuously perform read and write operations for rebuilding and storing data of a damaged nonvolatile memory and a parity check operation. Therefore, the rebuild operation can affect the bandwidth and response speed for access to the memory system 100 from the host.

Hence, the RAID system 1 according to an exemplary embodiment performs the first rebuild operation and the second rebuild operation having different rebuild rates. In so doing, the RAID system 1 according to an exemplary embodiment can perform a rebuild operation with minimal affect on its bandwidth and throughput.

Referring back to FIG. 1, the host interface may include a protocol for data exchange between the host and the RAID controller 200. For example, the RAID controller 200 may be configured to communicate with the host using at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, etc.

In the present exemplary embodiment, the RAID controller 200 and the memory system 100 may be integrated into one semiconductor device. For example, the RAID controller 200 and the memory system 100 may be integrated into one semiconductor device to form a memory card.

In another example, the RAID controller 200 and the memory system 100 may be integrated into one semiconductor device to form an SSD. When the RAID controller 200 and the memory system 100 are integrated into one semiconductor device and used as an SSD, the operation speed of the host connected to the nonvolatile memory system 100 may increase significantly. However, it is understood that one or more other exemplary embodiments are not limited to this case, and the RAID controller 200 and the memory system 100 can also be implemented as physically separate components that are attachable to or detachable from each other.

Alternatively, the RAID controller 200 and the memory system 100 may be integrated into one semiconductor device to form a memory card such as a personal computer (PC) card (e.g., Personal Computer Memory Card International Association (PCMCIA)), a compact flash card (CF), a smart media card (SM or SMC), a memory stick, a multimedia card (e.g., MMC, RS-MMC or MMCmicro), a Secure Digital (SD) card (e.g., SD, miniSD, microSD or SDHC), a universal flash storage (UFS), etc.

In another example, the nonvolatile memory system 100 may be provided as a computer, an ultra-mobile PC (UMPC), a workstation, a net-book computer, a personal digital assistant (PDA), a portable computer, a web tablet, a wireless phone, a mobile phone, a smart phone, an e-book, a portable multimedia player (PMP), a portable game console, a navigation device, a black box, a digital camera, a three-dimensional television, a digital audio recorder, a digital audio player, a digital picture recorder, a digital picture player, a digital video recorder, a digital video player, a device capable of transmitting/receiving information in wireless environments, one of various electronic devices constituting a home network, one of various electronic devices constituting a computer network, one of various electronic devices constituting a telematics network, a radio frequency identification (RFID) device, or one of various components constituting a computing system.

By way of example, the nonvolatile memory device or the nonvolatile memory system 100 may be packaged in various forms such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline integrated circuit (SOIC), shrink small outline package (SSOP), thin small outline package (TSOP), thin quad flat pack (TQFP), system in package (SIP), multi-chip package (MCP), wafer-level fabricated package (WFP), wafer-level processed stack package (WSP), etc.

Figure 3:
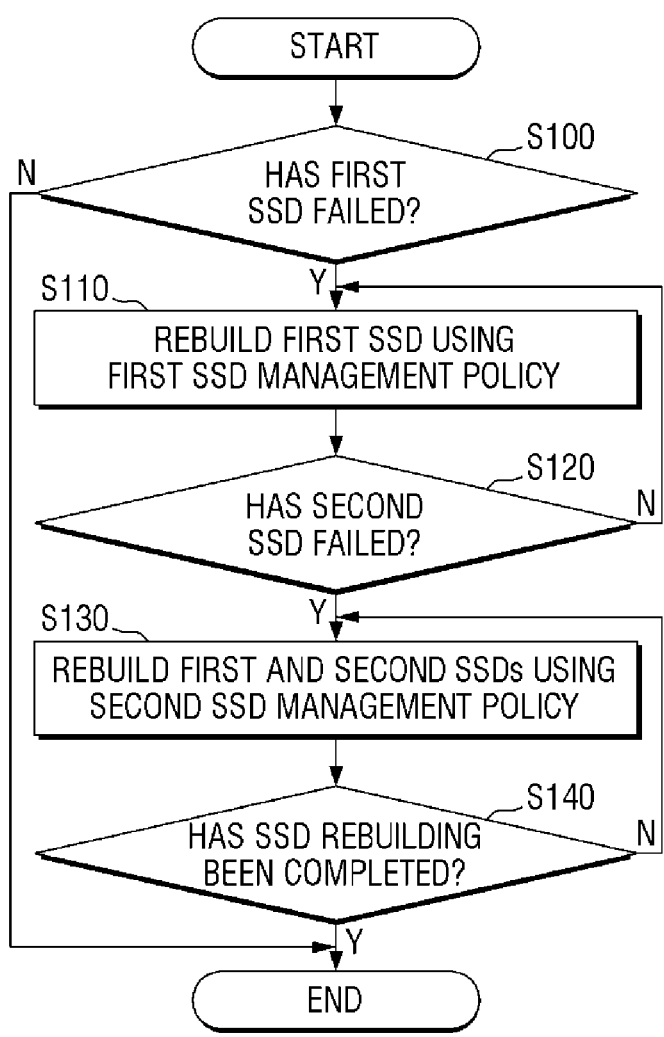
FIG. 3 is a flowchart illustrating first and second rebuild operations performed by the RAID system according to an exemplary embodiment.
Figure 4:
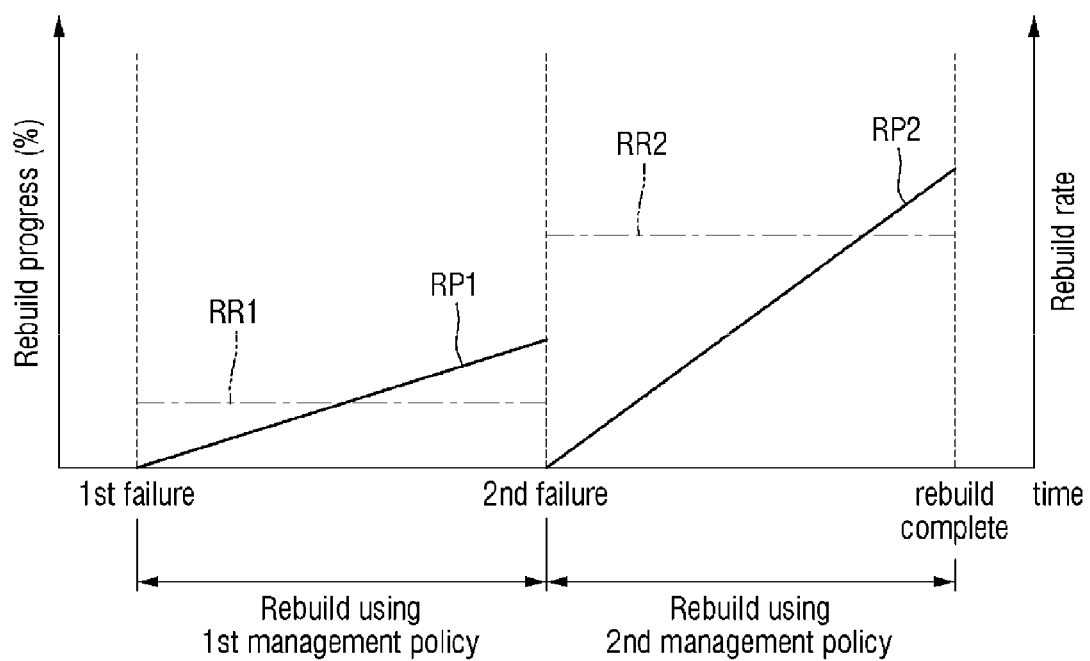
FIG. 4 is a graph illustrating the first and second rebuild operations performed by the RAID system according to an exemplary embodiment.

FIG. 3 is a flowchart illustrating first and second rebuild operations performed by the RAID system 1 according to an exemplary embodiment. FIG. 4 is a graph illustrating the first and second rebuild operations performed by the RAID system 1 according to an exemplary embodiment.

Referring to FIGS. 2A through 2C and 3, the RAID controller 200 included in the RAID system 1 according to the present exemplary embodiment determines whether a failure has occurred in a first nonvolatile memory (operation S100) and starts to rebuild the first nonvolatile memory using a first rebuild management policy (operation S110). During this first rebuild operation, the RAID controller 200 determines whether a failure has occurred in a second nonvolatile memory (operation S120). When a failure occurs in the second nonvolatile memory, the RAID controller 200 rebuilds the first nonvolatile memory and starts to rebuild the second nonvolatile memory using a second rebuild management policy (operation S130). Until the first and second nonvolatile memories are completely rebuilt, the RAID system 1 according to the present exemplary embodiment continues a rebuild operation (operation S140).

While controlling the operation of the memory system 100, the RAID controller 200 monitors whether the memory system 100 and the nonvolatile memories CHIP1 through CHIP8 which store data among the nonvolatile memories CHIP1 through CHIP10 included in the memory system 100 are abnormal (operation S100). The RAID controller 200 may determine whether a failure has occurred in any of the nonvolatile memories CHIP1 through CHIP8 by monitoring self-monitoring, analysis and reporting technology (SMART) information of the nonvolatile memories CHIP1 through CHIP8. More specifically, the RAID controller 200 may monitor numerical values such as a reallocated sector count and a raw read error rate in the SMART information and determine that a failure has occurred when these values exceed a predetermined reference value.

When detecting a failure in one (for example, CHIP5) of the nonvolatile memories CHIP1 through CHIP8, the RAID controller 200 performs a first rebuild operation using a first rebuild management policy having a first rebuild rate (operation S110).

Here, the first rebuild operation of the RAID controller 200 may be performed as shown in the graph of FIG. 4. After (e.g., immediately after) a first failure occurs, the first rebuild operation is performed using the first rebuild management policy. The first rebuild rate RR1 and rebuild progress RP1 of the first rebuild operation are illustrated in FIG. 4.

Referring to FIG. 4, the first rebuild rate RR1 of the first rebuild operation of the RAID controller 200 included in the RAID system 1 according to the present exemplary embodiment may be constant during the first rebuild operation.

While performing the first rebuild operation, the RAID controller 200 monitors the memory system 100 and the nonvolatile memories CHIP1 through CHIP4 and CHIP6 through CH8 to determine whether they are abnormal (operation S120).

When detecting a failure in one (for example, CHIP2) of the nonvolatile memories CHIP1 through CHIP4 and CHIP6 through CHIP8, the RAID controller 200 performs a second rebuild operation having a second rebuild rate (operation S130).

Here, the second rebuild operation of the RAID controller 200 may be performed as shown in the graph of FIG. 4. After (e.g., immediately after) a second failure occurs, the second rebuild operation is performed using the second rebuild management policy. The second rebuild rate RR2 and rebuild progress RP2 of the second rebuild operation are illustrated in FIG. 4.

Referring to FIG. 4, the second rebuild rate RR2 of the second rebuild operation of the RAID controller 200 included in the RAID system 1 according to the present exemplary embodiment may be constant during the second rebuild operation. In particular, the second rebuild rate RR2 of the second rebuild operation may be greater than the first rebuild rate RR1 of the first rebuild operation and equal to a maximum rebuild rate defined in the RAID system 1.

This may be due to the following reasons. While the first rebuild operation is being performed due to a failure in one nonvolatile memory chip (e.g., CHIP5), the first rebuild rate RR1 may be kept as small as possible in order to reduce the effect of an I/O rate on the RAID system 1.

In addition, the memory system 100 of the RAID system 1 according to the present exemplary embodiment includes two parity bits P and Q as described above. Therefore, even when a failure occurs in a maximum of two nonvolatile memories, data can be rebuilt using the two parity bits P and Q. That is, even when the first rebuild operation is being performed, there is room for failure of an additional nonvolatile memory, and the need for immediate rebuilding of a failed nonvolatile memory is relatively small.

Therefore, the first rebuild rate RR is set to be less than the maximum rebuild rate of the RAID system 1 in order to minimize the effect of rebuilding on the I/O bandwidth or throughput of the RAID system 1.

When a failure occurs in an additional nonvolatile memory during the first rebuild operation, the maximum number of nonvolatile memory for rebuilding data using two parity bits P and Q is reached because two nonvolatile memories have failed. In this case, if a failure occurs in a third nonvolatile memory, data stored in the third nonvolatile memory may be lost because it cannot be rebuilt.

Therefore, the second rebuild operation may be performed without considering the effect of the second rebuild operation on the I/O bandwidth or the throughput of the RAID system 1. That is, the second rebuild management policy can have the maximum rebuild rate defined in the RAID system 1, and the RAID system 1 can be rebuilt as quickly as possible.

In summary, the RAID system 1 according to the present exemplary embodiment applies the first rebuild management policy having the first rebuild rate RR1 when performing the first rebuild operation that may have a significant influence on the I/O bandwidth or throughput of the RAID system 1.

On the other hand, the RAID system 1 applies the second rebuild management policy having the second rebuild rate RR2 different from the first rebuild rate RR1 when performing the second rebuild operation in which fast rebuilding is important. In one or more exemplary embodiments, the second rebuild rate RR2 may be greater than the first rebuild rate RR1 and, more specifically, may be equal to the maximum rebuild rate of the RAID system 1.

Figure 5:
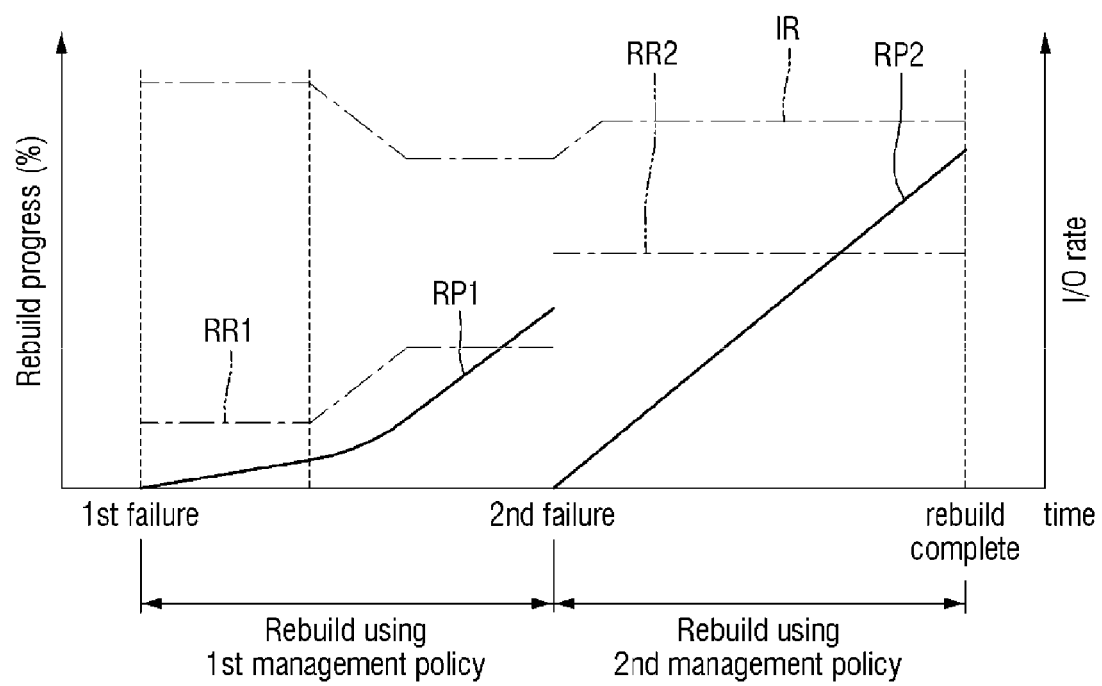
FIG. 5 is a graph illustrating a rebuild operation of a RAID system according to another exemplary embodiment.

FIG. 5 is a graph illustrating a rebuild operation of the RAID system 1 according to another exemplary embodiment.

Referring to FIG. 5, in the RAID system 1 according to an exemplary embodiment, a rebuild management policy applied to a rebuild operation, specifically, a rebuild rate of a rebuild management policy, may be different from the rebuild rate according to the above-described exemplary embodiment.

More specifically, the first rebuild rate RR1 of the first rebuild operation performed by the RAID system 1 may vary according to an external I/O rate IR of the RAID system 1. Here, the external I/O rate IR of the RAID system 1 denotes a data transfer rate between the RAID system 1 and the host, that is, between the RAID system 1 and an external device. Even during the first rebuild operation, the RAID system 1 can exchange I/O signals with the host in response to a request from the host. Here, the first rebuild rate RR1 of the first rebuild operation of the RAID system 1 may be set to vary in inverse proportion to the external I/O rate IR of the RAID system 1.

That is, as described above, the first rebuild management policy having the first rebuild rate smaller than the maximum rebuild rate is applied to the first rebuild operation in order to reduce the effect of the first rebuild operation on the I/O bandwidth or throughput of the RAID system 1. However, if there is room in the I/O bandwidth or throughput of the RAID system 1 that is affected by the first rebuild rate, the first rebuild rate may be increased. Conversely, if the I/O rate IR of the RAID system 1 increases, the first rebuild rate may be decreased. That is, the first rebuild management policy may include adjusting the first rebuild rate RR1 in inverse proportion to the I/O rate IR of the RAID system 1.

As illustrated in FIG. 5, during the first rebuild operation, as the I/O rate IR of the RAID system 1 decreases, the first rebuild rate RR1 increases in inverse proportion to the I/O rate IR.

On the other hand, during the second rebuild operation, the second rebuild rate RR2 remains unchanged regardless of the change in the I/O rate IR of the RAID system 1. In the second rebuild operation performed due to the failure of two nonvolatile memories, data can be lost if quick rebuilding is not given priority. Therefore, despite the change of the I/O rate IR of the RAID system 1, the second rebuild rate RR2 may be maintained at a constant value. In one or more exemplary embodiments, the second rebuild management policy may include maintaining the second rebuild rate RR2 at the maximum rebuild rate. According to another exemplary embodiment, the second rebuild management policy may include maintaining the second rebuild rate RR2 at some constant value a predetermined amount below the maximum rebuild rate, or at some variable value between a constant value and the maximum rebuild rate.

Figure 6A:
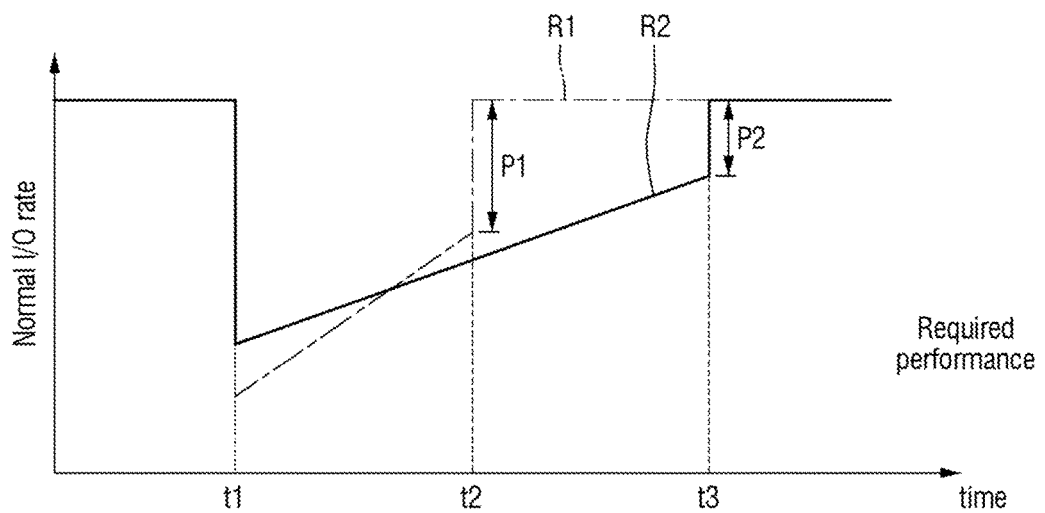
FIGS. 6A and 6B are graphs illustrating an operation of determining a first rebuild management policy having a first rebuild rate in the RAID system according to an exemplary embodiment.
Figure 6B:
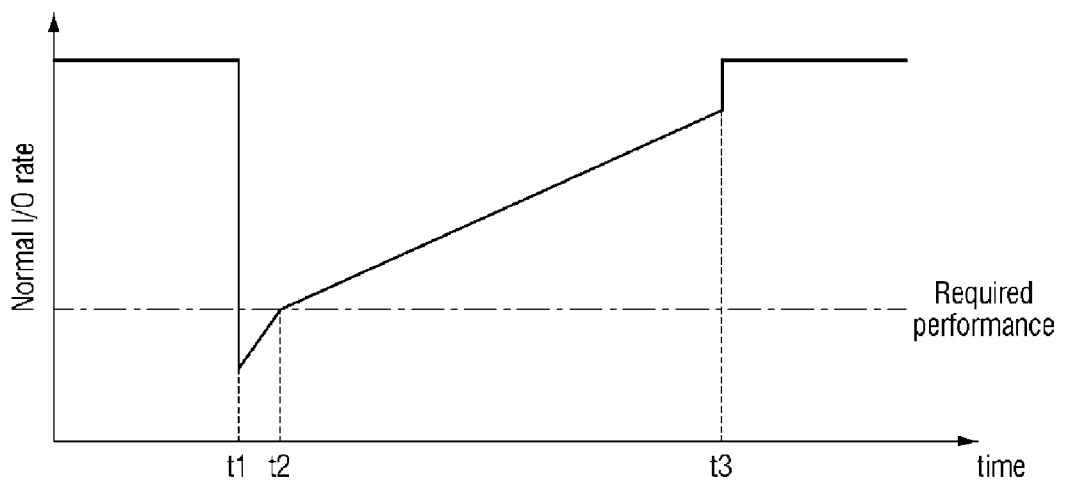

FIGS. 6A and 6B are graphs illustrating an operation of determining a first rebuild management policy having a first rebuild rate in the RAID system 1 according to an exemplary embodiment.

First, referring to FIG. 6A, the change in the normal I/O rate of the RAID system 1 due to the first rebuild operation of the RAID system 1 is illustrated. In FIG. 6A, an R1 graph represents the change in the normal I/O rate of the RAID system 1 when the first rebuild rate is R1, and an R2 graph represents the change in the normal I/O rate of the RAID system 1 when the first rebuild rate is R2 (R1>R2).

As illustrated in FIG. 6A, different first rebuild rates R1 and R2 of the RAID system 1 may form graphs of different normal I/O rates of the RAID system 1.

Referring to FIG. 6A, when a failure occurs in a first nonvolatile memory at a time t1, if the first rebuild operation is performed using the first rebuild rates of R1 and R2, the first rebuild operation is completed at times t2 and t3. Here, as the rebuild operation proceeds, the normal I/O rate of the RAID system 1 tends to increase between the times t1 and t2 or between the times t1 and t3.

During the first rebuild operation, multiple data reads are performed to access data in a nonvolatile memory to be rebuilt, particularly, in a block that has not been completely rebuilt. This may cause a decrease in the normal I/O rate of the RAID system 1. Here, as the rebuild operation progresses, a data access probability for blocks that have not been completely rebuilt is reduced, and a reduction in the normal I/O rate of the RAID system 1 is also reduced.

In FIG. 6A, P1 indicates a reduction in the normal I/O rate of the RAID system 1 caused by the first rebuild operation performed using the first rebuild management policy having the first rebuild rate of R1. In addition, P2 indicates a reduction in the normal I/O rate of the RAID system 1 caused by the first rebuild operation performed using the first rebuild management policy having the first rebuild rate of R2.

Referring to FIG. 6B, the rebuild rates of R1 and R2 shown in the two graphs of FIG. 6A may be applied in combination with the first rebuild operation. That is, the first rebuild management policy having a first sub-rate R1 of the RAID system 1 is applied until the normal I/O rate of the RAID system 1 reaches a required I/O rate. After a time t2 at which the normal I/O rate of the RAID system 1 reaches the required I/O rate, the first rebuild operation may be performed quickly using the first rebuild management policy having a second sub-rate R2.

In one or more exemplary embodiments, the first sub-rate R1 may be greater than the second sub-rate R2 (R1>R2).

Figure 7:
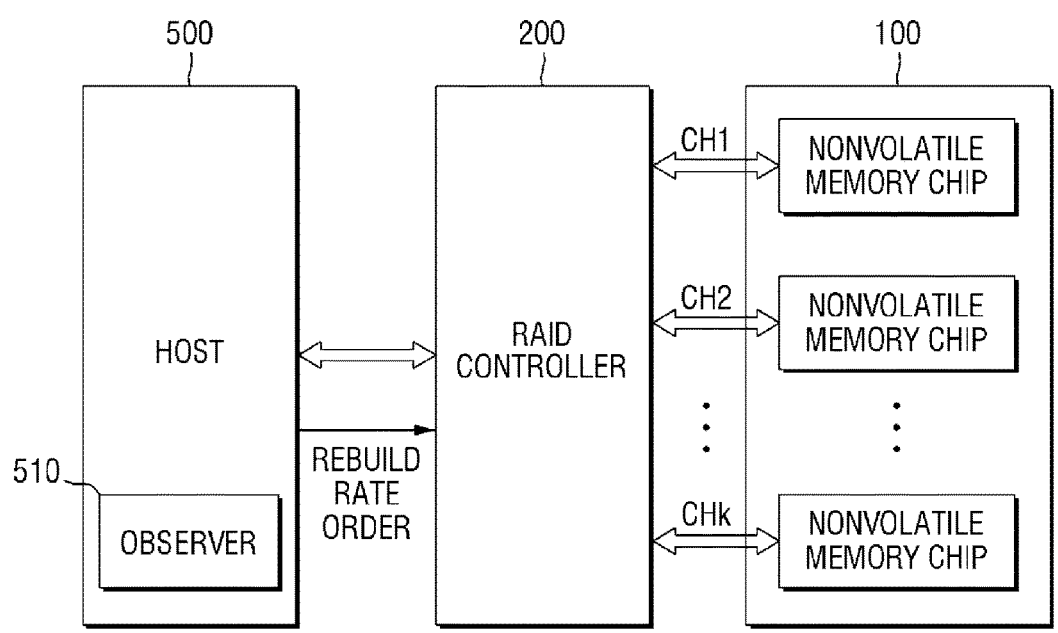
FIG. 7 is a block diagram of a RAID system according to an exemplary embodiment.

FIG. 7 is a block diagram of a RAID system 2 according to an exemplary embodiment.

Referring to FIG. 7, the RAID system 2 according to an exemplary embodiment may include a memory system 100, a RAID controller 200, and a host 500. Here, the memory system 100 and the RAID controller 200 are configured in the same way or a similar way as the memory system 100 (see FIG. 1) and the RAID controller 200 (see FIG. 1) of the RAID system 1 (see FIG. 1) according to the above-described exemplary embodiment.

The host 500 may include an observer 510 (e.g., a processing element or processor). In the RAID system 2 according to the present exemplary embodiment, the observer 510 observes the operation of the RAID system 2 or the operation of a computing system including the RAID system 2. If the observer 510 determines to change a first rebuild rate of a first rebuild management policy as a result of observing the operation of the system, the observer 510 controls the host 500 to send a rebuild rate command (order) to the RAID controller 200. The RAID controller 200 provided with the rebuild rate command may change the first rebuild rate of the first rebuild management policy.

Figure 8:
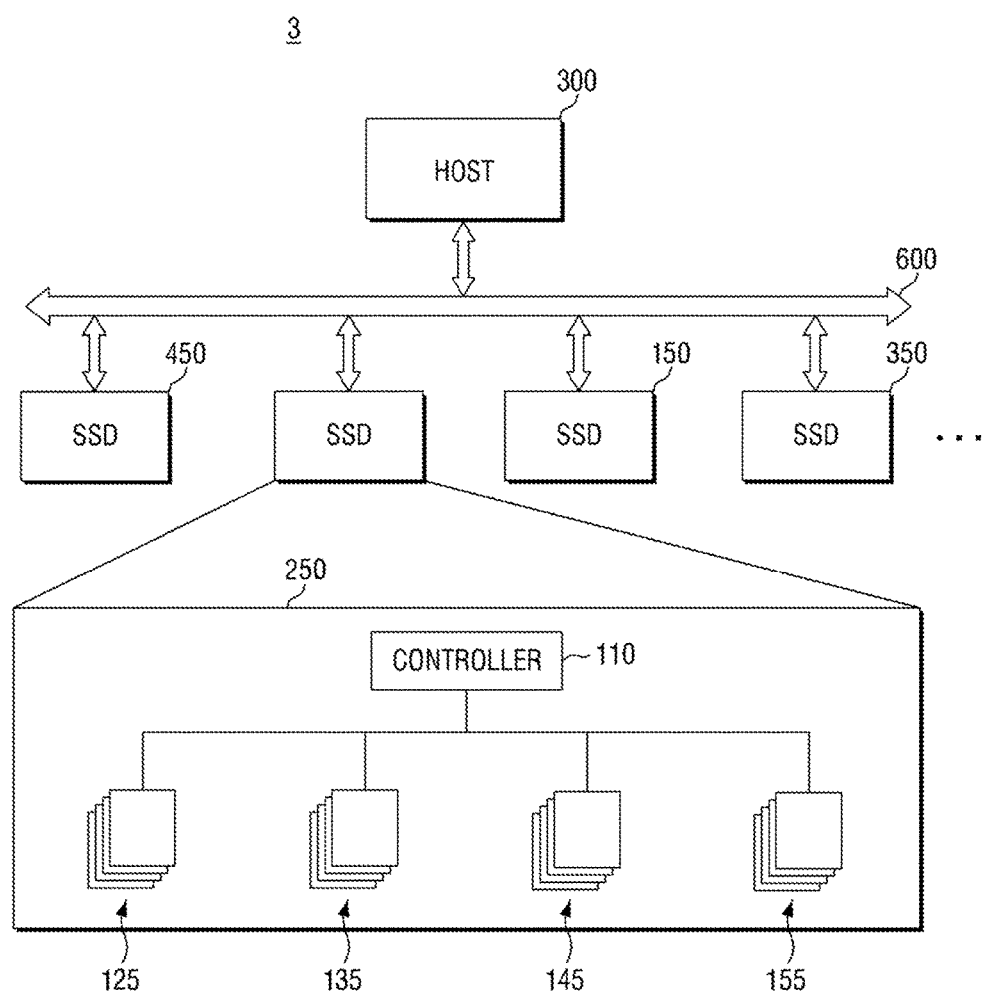
FIG. 8 is a block diagram of a RAID system according to an exemplary embodiment.

FIG. 8 is a block diagram of a RAID system 3 according to an exemplary embodiment.

Referring to FIG. 8, the RAID system 3 according to an exemplary embodiment includes a host 300, SSDs 150, 250, 350 and 450, and a bus 600.

The host 300 of the RAID system 3 according to the present exemplary embodiment may be configured and operated in substantially the same way as the RAID controller 200 described above with reference to FIG. 1.

The SSD 250 may include a plurality of memory chips 125, 135, 145 and 155 and a memory controller 110.

The memory controller 110 may control the memory chips 125, 135, 145 and 155. In one or more exemplary embodiments, the memory chips 125, 135, 145 and 155 may be configured and operated in the same way or a similar way as the nonvolatile memories included in the memory system 100 of the RAID system 1 described above. Therefore, the memory controller 110 may configure a RAID system 3 including the memory chips 125, 135, 145 and 155.

In addition, the memory chips 125, 135, 145 and 155 may include memory chips that store data chunks and two parity bits P and Q and spare or additional memory chips. The memory controller 110 may perform a first rebuild operation on the RAID system 3 configured as described above by applying a first rebuild management policy having a first rebuild rate and perform a second rebuild operation on the RAID system 3 by applying a second rebuild management policy having a second rebuild rate different from the first rebuild rate.

A RAID system 3 can also be configured using SSDs connected to the host 300. That is, the SSDs 150, 250, 350 and 450 may include SSDs that store data chunks and parity bits and spare SSDs. The host 300 may perform a first rebuild operation on the RAID system 3 configured as described above by applying a third rebuild management policy having a third rebuild rate and perform a second rebuild operation on the RAID system 3 by applying a fourth rebuild management policy having a fourth rebuild rate different from the third rebuild rate.

In the process of rebuilding the SSDs 150, 250, 350 and 450, a different rebuild management policy may be applied to each of the SSDs 150, 250, 350 and 450. For example, data chunks and parity bits may be stored in the SSDs 150, 250 and 350, and a failure may occur in the SSD 150. In this case, the host 300 may initiate a first rebuild operation on a spare or additional SSD using the data chunks and the parity bits stored in the SSDs 250 and 350. Here, the host 300 may measure the effect of the rebuild operation of each of the SSDs 250 and 350 on the entire system and control the SSDs 250 and 350 to perform the first rebuild operation using rebuild management policies having different first rebuild rates.

A computing system according to an exemplary embodiment will now be described with reference to FIG. 9.

Figure 9:
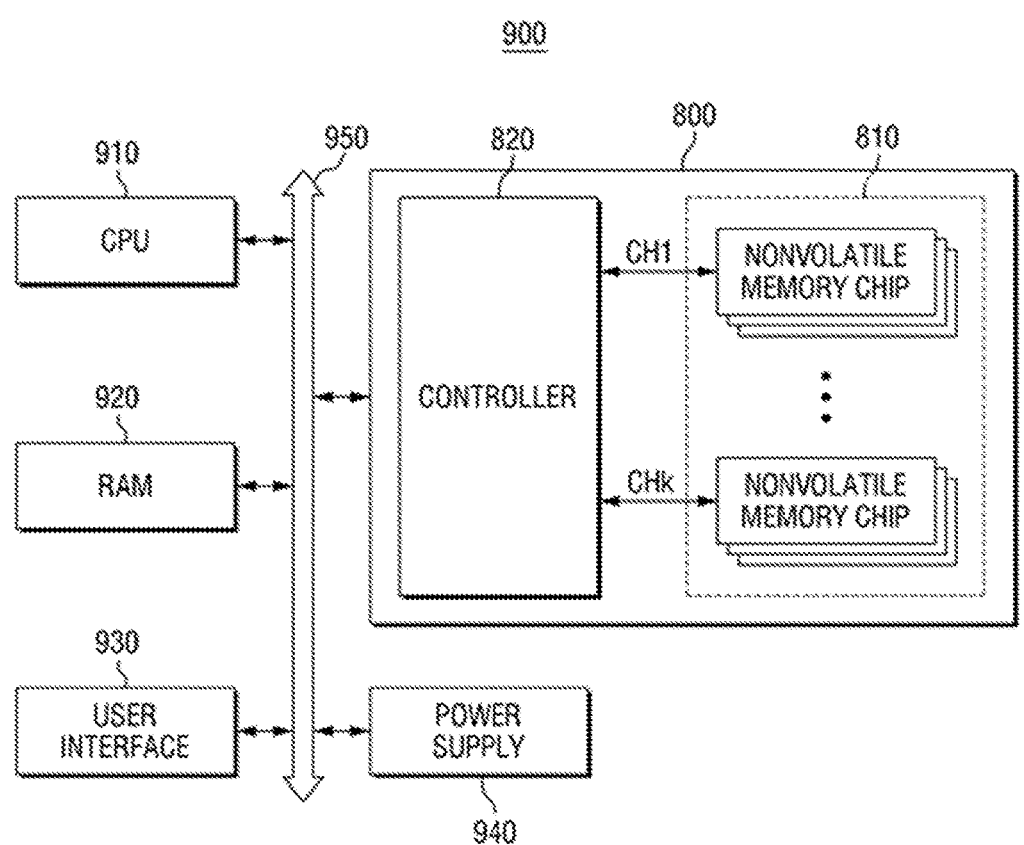
FIG. 9 is a block diagram of a computing system according to an exemplary embodiment.

FIG. 9 is a block diagram of a computing system 900 according to an exemplary embodiment.

Referring to FIG. 9, the computing system 900 includes a central processing unit (CPU) 910, a RAM 920, a user interface 930, a power supply 940, and a memory system 800.

The memory system 800 may be a system in which a controller 820 controls a nonvolatile memory device 810 according to one or more of the above-described exemplary embodiments. The memory system 800 may be electrically connected to the CPU 910, the RAM 920, the user interface 930, and the power supply 940 through a system bus 950. Data provided through the user interface 930 or processed by the CPU 910 may be stored in the memory system 800.

In FIG. 9, the nonvolatile memory device 810 is connected to the system bus 950 through the controller 820. However, in computing systems according to one or more other exemplary embodiments, the nonvolatile memory device 810 can also be connected directly to the system bus 950.

While not restricted thereto, an exemplary embodiment can be embodied as computer-readable code on a computer-readable recording medium. The computer-readable recording medium is any data storage device that can store data that can be thereafter read by a computer system. Examples of the computer-readable recording medium include read-only memory (ROM), random-access memory (RAM), CD-ROMs, magnetic tapes, floppy disks, and optical data storage devices. The computer-readable recording medium can also be distributed over network-coupled computer systems so that the computer-readable code is stored and executed in a distributed fashion. Also, an exemplary embodiment may be written as a computer program transmitted over a computer-readable transmission medium, such as a carrier wave, and received and implemented in general-use or special-purpose digital computers that execute the programs. Moreover, it is understood that in exemplary embodiments, one or more components of the above-described system can include circuitry, a processor, a microprocessor, etc., and may execute a computer program stored in a computer-readable medium.

One or more exemplary embodiments have been described above with reference to the attached drawings, but it may be understood by one of ordinary skill in the art that the present disclosure may be performed one of ordinary skill in the art in other specific forms without changing the technical concept or essential features of the present disclosure. Further, the above-described exemplary embodiments are merely examples and do not limit the scope of the rights of the present disclosure.

What is claimed is:

1. A redundant array of inexpensive disks (RAID) system comprising:
 a memory device comprising a plurality of nonvolatile memories forming a RAID and storing data chunks and a first parity bit and a second parity bit corresponding to the data chunks;
 a RAID controller configured to control a RAID operation and a rebuild operation of the memory device; and
 a host configured to communicate with the RAID controller at an input/output (I/O) rate,
 wherein the RAID controller is configured to control:
  to perform a first rebuild operation using the first parity bit stored in the memory device and a first rebuild management policy having a first rebuild rate,
  to apply a first sub-rate as the first rebuild rate until the I/O rate between the RAID controller and the host reaches a predetermined value,
  to apply a second sub-rate, different from the first sub-rate, as the first rebuild rate when the I/O rate is greater than the predetermined value, and
  to perform a second rebuild operation using the first parity bit and the second parity bit stored in the memory device and a second rebuild management policy having a second rebuild rate different from the first rebuild rate.

2. The RAID system of claim 1, wherein the second rebuild rate is greater than the first rebuild rate.

3. The RAID system of claim 2, wherein the second rebuild rate is a maximum rebuild rate of a rebuild operation of the memory device.

4. The RAID system of claim 1, wherein the first rebuild rate is inversely proportion to the I/O rate of the RAID controller.

5. The RAID system of claim 4, wherein the second rebuild rate maintains a constant value regardless of the I/O rate of the RAID controller.

6. The RAID system of claim 1, wherein the first sub-rate is greater than the second sub-rate.

7. The RAID system of claim 1, wherein the host comprises an observer configured to observe the operation of the RAID system and to provide a rebuild rate command to the RAID controller based on a result of the observing by the observer, and the RAID controller is configured to control the first rebuild rate according to the received rebuild rate command.

8. The RAID system of claim 1, wherein the RAID controller is configured to control to perform the first rebuild operation based on whether a monitoring self-monitoring, analysis and reporting technology (SMART) value of the plurality of nonvolatile memories exceeds a predetermined reference value.

9. The RAID system of claim 1, wherein the plurality of nonvolatile memories comprises a first nonvolatile memory and a second nonvolatile memory, and the RAID controller is configured to control to perform the first rebuild operation using the first parity bit when a failure occurs in the first nonvolatile memory and to perform the second rebuild operation using the first parity bit and the second parity bit when a failure occurs in the second nonvolatile memory during the first rebuild operation.

10. A RAID system comprising:
 a host; and
 a plurality of solid state drives (SSDs) coupled to the host, wherein each of the plurality of SSDs comprises:
  a plurality of nonvolatile memories which form a RAID and store data chunks and a first parity bit and a second parity bit corresponding to the data chunks; and
 a RAID controller configured to control a RAID operation and a rebuild operation of the plurality of nonvolatile memories,
 wherein the RAID controller is configured to control to perform a first rebuild operation using the first parity bit stored in the plurality of nonvolatile memories and a first rebuild management policy having a first rebuild rate, and to perform a second rebuild operation using the first parity bit and the second parity bit stored in the plurality of nonvolatile memories and a second rebuild management policy having a second rebuild rate different from the first rebuild rate.

11. The RAID system of claim 10, wherein the RAID controller is configured to apply a first sub-rate as the first rebuild rate until an I/O rate between the RAID controller and the host reaches a predetermined value, and to apply a second sub-rate, different from the first sub-rate, as the first rebuild rate when the I/O rate is greater than the predetermined value.

12. The RAID system of claim 10, wherein the first rebuild operation is performed when a failure occurs in one of the plurality of nonvolatile memories, and the second rebuild operation is performed when a failure occurs in two of the plurality of nonvolatile memories.

13. The RAID system of claim 10, wherein the plurality of SSDs comprises:
a first SSD configured to store the data chunks and the first parity bit and the second parity bit corresponding to the data chunks; and
a second SSD configured to store rebuilt data of the first SSD when a failure occurs in the first SSD,
wherein the first SSD and the second SSD form the RAID.

14. The RAID system of claim 13, wherein the first SSD comprises a first drive and a second drive storing different pieces of data, and the host is configured to rebuild the first SSD by applying a third rebuild management policy having a third rebuild rate to the first drive and applying a fourth rebuild management policy having a fourth rebuild rate to the second drive.

15. The RAID system of claim 10, wherein the plurality of nonvolatile memories comprise a first nonvolatile memory and a second nonvolatile memory, and the RAID controller is configured to control to perform the first rebuild operation using the first parity bit when a failure occurs in the first nonvolatile memory and to perform the second rebuild operation using the first parity bit and the second parity bit when a failure occurs in the second nonvolatile memory during the first rebuild operation.

16. A method of performing a rebuild operation in a memory device forming a RAID and storing data chunks and a first parity bit and a second parity bit corresponding to the data chunks, the method comprising:
in response to a first failure in the memory device, controlling to perform a first rebuild operation using the first parity bit stored in the memory device and a first rebuild management policy having a first rebuild rate; and
in response to a second failure in the memory device, controlling to perform a second rebuild operation using the first parity bit and the second parity bit stored in the memory device and a second rebuild management policy having a second rebuild rate different from the first rebuild rate.

17. The method of claim 16, wherein the controlling to perform the first rebuild operation comprises:
controlling to apply a first sub-rate as the first rebuild rate until an I/O rate of the RAID reaches a predetermined value; and
controlling to apply a second sub-rate, different from the first sub-rate, as the first rebuild rate when the I/O rate is greater than the predetermined value.

18. The method of claim 16, wherein the second rebuild rate is greater than the first rebuild rate.

19. The method of claim 16, wherein the first rebuild rate is inversely proportion to an I/O rate of the RAID.

20. The method of claim 16, wherein:
the controlling to perform the first rebuild operation comprises controlling to perform the first rebuild operation using the first parity bit when a failure occurs in a first nonvolatile memory of the memory device; and
the controlling to perform the second rebuild operation comprises controlling to perform the second rebuild operation using the first parity bit and the second parity bit when a failure occurs in the second nonvolatile memory during the first rebuild operation.

* * * * *